United States Patent [19]

Fujii et al.

[11] Patent Number: 5,216,264
[45] Date of Patent: Jun. 1, 1993

[54] SILICON CARBIDE MOS TYPE FIELD-EFFECT TRANSISTOR WITH AT LEAST ONE OF THE SOURCE AND DRAIN REGIONS IS FORMED BY THE USE OF A SCHOTTKY CONTACT

[75] Inventors: Yoshihisa Fujii; Akira Suzuki, both of Nara; Katsuki Furukawa, Sakai; Mitsuhiro Shigeta, Kyoto, all of Japan

[73] Assignee: Sharp Kabushiki Kaisha, Osaka, Japan

[21] Appl. No.: 759,933

[22] Filed: Sep. 16, 1991

Related U.S. Application Data

[63] Continuation of Ser. No. 534,046, Jun. 6, 1990, abandoned.

[30] Foreign Application Priority Data

Jun. 7, 1989 [JP]  Japan ................................ 1-145618

[51] Int. Cl.⁵ ................. H01L 29/76; H01L 31/0312; H01L 27/095; H01L 23/48
[52] U.S. Cl. .................................... 257/289; 257/77; 257/383; 257/384; 257/472; 257/613; 257/769
[58] Field of Search ................. 357/2, 4, 22, 23.1, 357/23.2, 67, 61, 15; 437/100, 105

[56] References Cited

U.S. PATENT DOCUMENTS

| | | | |
|---|---|---|---|
| 4,503,598 | 3/1985 | Vora et al. | 357/23.4 |
| 4,757,028 | 7/1988 | Kondoh et al. | 437/100 |
| 4,762,806 | 8/1988 | Suzuki et al. | 437/100 |
| 4,897,710 | 1/1990 | Suzuki et al. | 357/2 |
| 4,912,063 | 3/1990 | Davis et al. | 437/105 |
| 4,914,050 | 4/1990 | Shibata | 357/23.1 |
| 4,990,994 | 2/1991 | Furukawa et al. | 357/67 |

FOREIGN PATENT DOCUMENTS

| | | | |
|---|---|---|---|
| 57-148342 | 9/1982 | Japan | 357/23.4 |
| 59-203799 | 11/1984 | Japan | |
| 62-188373 | 8/1987 | Japan | 437/100 |
| 62-209855 | 9/1987 | Japan | 437/100 |
| 63-303900 | 12/1988 | Japan | 437/100 |
| 0186547 | 3/1989 | Japan | 437/100 |

OTHER PUBLICATIONS

J. Electrochem. Soc., 135 (1988) 359-362, "Electrical Contacts to Beta Silicon Carbide Thin Films" by Edmond et al.

J. Appl. Phys. 64(4), Aug. 15, 1988, "Characterization of Device Parameters in High Temperature Metal-Oxide-Semiconductor Field-Effect Transistors in B-SiC thin Films" by Palmour et al., pp 2168-2177.

*Primary Examiner*—Rolf Hille
*Assistant Examiner*—Steven Loke
*Attorney, Agent, or Firm*—David G. Conlin; Robert F. O'Connell

[57] ABSTRACT

A silicon carbide field-effect transistor is disclosed which includes an MOS structure composed successively of a silicon carbide layer, a gate insulator film, and a gate electrode. The field-effect transistor has source and drain regions formed in the silicon carbide layer, between which the MOS structure is disposed, wherein at least one of the source and drain regions is formed by the use of a Schottky contact on the silicon carbide layer.

8 Claims, 2 Drawing Sheets

SILICON CARBIDE MOS TYPE FIELD-EFFECT TRANSISTOR WITH AT LEAST ONE OF THE SOURCE AND DRAIN REGIONS IS FORMED BY THE USE OF A SCHOTTKY CONTACT

This is a continuation of copending application Ser. No. 07/534,046 filed on Jun. 6, 1990, now abandoned.

BACKGROUND OF THE INVENTION

1. Field of the Invention

This invention relates to a silicon carbide field-effect transistor and more particularly to a silicon carbide field-effect transistor having source and drain regions in a silicon carbide layer, at least one of the source and drain regions being formed by the use of a Schottky contact on the silicon carbide layer.

2. Description of the Prior Art

Silicon carbide (SiC) is a semiconductor material with a wide band gap of 2.3 to 3.3 electronvolts (eV), which is thermally, chemically and mechanically quite stable, and also has a great resistance to radiation damage. Furthermore, the saturation drift velocity of electrons in silicon carbide is greater than that in silicon (Si) and other semiconductor materials. The use of semiconductor devices made of conventional semiconductor materials such as silicon is difficult under severe conditions of high temperature, high output drive, high frequency operation, and radiation exposure. Therefore, semiconductor devices using silicon carbide are expected to have wide applications for devices which are used under such conditions.

Despite these many advantages and capabilities, a silicon carbide semiconductor device has not yet been put into actual use, because the technique still remains to be established for growing high quality silicon carbide single crystals having a large surface area with good reproducibility required for the commercial production thereof.

In recent years, there has been developed a process for growing large-sized high-quality single crystals of silicon carbide on a single-crystal substrate of silicon by the chemical vapor deposition (CVD) technique (e.g., Japanese Laid-Open Patent Publication No. 59-203799). This technique makes it possible to control the conductivity type, the impurity concentration, or the like of silicon carbide single crystals obtained by adding an appropriate amount of impurities during the growth of the single crystals. Therefore, this technique makes many contributions to the development of various semiconductor devices by the use of silicon carbide single crystals. Examples of the silicon carbide semiconductor devices include an inversion-mode metal-oxide-semiconductor field-effect transistor (MOSFET) fabricated on a silicon carbide layer which functions as a channel-formation layer. As used herein, the term channel-formation layer refers to a semiconductor layer in which a channel region will be formed in the on state of the transistor.

In general, for the purpose of producing an inversion-mode MOSFET, a channel-formation layer should be formed in a semiconductor substrate or semiconductor layer grown thereon. The channel-formation layer should also be provided with source and drain regions of the opposite conductivity type thereto. In other words, when an inversion-mode n-channel MOSFET is fabricated with the use of a p-type channel-formation layer, the source and drain regions of the n-type must be formed in the p-type channel-formation layer. When an inversion-mode p-channel MOSFET is fabricated with the use of an n-type channel-formation layer, the source and drain regions of the p-type must be formed in the n-type channel-formation layer. In order that these MOSFETs may exhibit satisfactory device characteristics, the source and drain regions are required to satisfy the following two conditions. First, pn junctions between the source region and the channel-formation layer and between the drain region and the channel-formation layer should have excellent characteristics to reduce leakage current. Second, the electrical resistivity of the source and drain regions as well as the contact resistance between these regions and the wiring metal should be sufficiently small to reduce the on-state resistance of the transistor.

Usually, the source and drain regions are formed in the channel-formation layer by ion implantation or thermal diffusion of impurities. These methods are available for the production of silicon semiconductor devices with a channel-formation layer made of silicon and they have already been established as a device process technique. By contrast, in the case of silicon carbide semiconductor devices with a channel-formation layer made of silicon carbide, the above-mentioned methods are not available for the following reasons. The thermal diffusion method requires a high diffusion temperature of 1600° C. or more, because of small diffusion coefficient of impurities in silicon carbide. Therefore, the control of impurity concentration in the silicon carbide layer is difficult and moreover, the semiconductor substrate and the channel-formation layer may deteriorate. On the other hand, the ion implantation method has the disadvantages in that impurities implanted in the silicon carbide layer are relatively stable and the amount of impurities ionized in the silicon carbide layer is small. Therefore, the electrical resistivity of the source and drain regions formed in the channel-formation layer cannot sufficiently be decreased. Moreover, the ion implantation method has the disadvantages in that pn junctions with satisfactory excellent characteristics cannot be obtained. Therefore, silicon carbide MOSFETs, which have been recently developed, cannot be used for practical applications because of large leakage current and large on-state resistance.

SUMMARY OF THE INVENTION

The silicon carbide field-effect transistor of this invention, which overcomes the above-discussed and numerous other disadvantages and deficiencies of the prior art, has an MOS structure composed successively of a silicon carbide layer, a gate insulator film, and a gate electrode, the transistor comprising source and drain regions formed in the silicon carbide layer, and the MOS structure being disposed between the source and drain regions, wherein at least one of the source and drain regions is formed by the use of a Schottky contact on the silicon carbide layer.

The Schottky contact on the n-type silicon carbide layer in a preferred embodiment is made with a metal such as platinum (Pt), gold (Au) or titanium (Ti), or with a compound thereof.

The Schottky contact on the p-type silicon carbide layer in a preferred embodiment is made with a metal such as aluminum (Al) or silver (Ag), or with a compound thereof.

The gate insulator film in a preferred embodiment is formed from silicon oxide.

The gate electrode in a preferred embodiment is formed from polycrystalline silicon.

Thus, the invention described herein makes possible the objectives of (1) providing a silicon carbide field-effect transistor (e.g., metal-oxide-semiconductor field-effect transistor, MOSFET) in which at least one of the source and drain regions is formed by the use of a Schottky contact on the silicon carbide layer, so that leakage current and on-state resistance can significantly be reduced, resulting in quite excellent device characteristics; and (2) providing a silicon carbide field-effect transistor which can be used under severe conditions of high temperature, high output drive, high frequency operation, and radiation exposure, where difficulties are encountered with devices made of conventional semiconductor materials, particularly silicon.

BRIEF DESCRIPTION OF THE DRAWINGS

This invention may be better understood and its numerous objects and advantages will become apparent to those skilled in the art by reference to the accompanying drawings as follows:

FIG. 1b–1e are sectional views showing the production of the MOSFET of FIG. 1a.

FIG. 2 is a graph showing the drain current-voltage characteristics of the MOSFET of FIG. 1a.

DETAILED DESCRIPTION OF THE INVENTION

The silicon carbide field-effect transistor of this invention has source and drain regions formed by the use of a Schottky contact on the silicon carbide layer. In general, it is known that Schottky contacts exhibit rectifying characteristics, as well as pn junctions. Therefore, such Schottky contacts can also be used to reduce the leakage current of the field-effect transistors.

The Schottky contact can readily be formed by depositing a thin metal film on the silicon carbide layer or subsequently reacting the thin metal film with the silicon carbide layer to form a thin film made of the compound of this metal. Unlike the case of ion implantation, the silicon carbide layer will not change its properties when the Schottky contact is being formed thereon, so that the Schottky contact obtained can exhibit better rectifying characteristics than that of the pn junction formed by ion implantation. Moreover, metal materials used for forming a Schottky contact usually have an extremely small resistivity as compared to semiconductors, and also have a sufficiently small contact resistance to other metals used as a wiring material. Therefore, with the use of a Schottky contact, the on-state resistance of the field-effect transistor can satisfactory be reduced.

The metals and compounds thereof which are used for forming a Schottky contact may be those which can provide a Schottky contact on the silicon carbide layer. Specific examples of the metal used for the n-type silicon carbide layer are those such as platinum (Pt), gold (Au), and titanium (Ti). Specific examples of the metal used for the p-type silicon carbide layer are those such as aluminum (Al) and silver (Ag). Various compounds of these metals (e.g., compounds containing silicon and/or carbon together with one of these metals) can also be used.

DESCRIPTION OF THE PREFERRED EMBODIMENTS

The invention will be further explained by reference to the following illustrative examples.

EXAMPLES

Figure 1A:
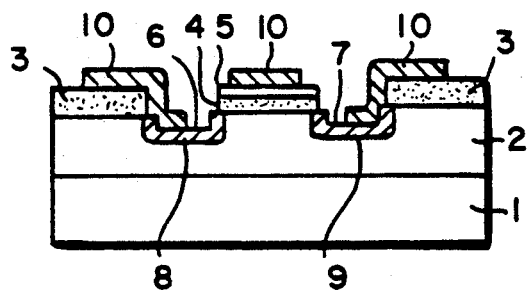
FIG. 1a is a sectional view showing an inversion-mode p-channel metal-oxide-semiconductor field-effect transistor (MOSFET) of this invention.

FIG. 1a shows an inversion-mode p-channel MOSFET of this invention. The MOSFET was produced as follows.

Figure 1B:
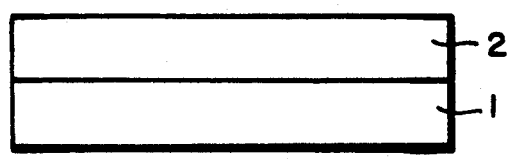

First, as shown in FIG. 1b, on an Si single-crystal substrate 1, a $\beta$-SiC single-crystal layer 2 (the thickness thereof being about 10 $\mu$m) was grown by the chemical vapor deposition (CVD) technique. The $\beta$-SiC single-crystal layer 2 was used as a channel-formation layer in which a channel region would be formed in the on state of the transistor. The source gases were silane ($SiH_4$) and propane ($C_3H_8$). No impurity gases were introduced in the reaction tube while the $\beta$-SiC single crystal was being grown. The $\beta$-SiC single-crystal layer 2 obtained in this way was of the n-type (the carrier concentration thereof being $2 \times 10^{16}$ cm$^{-3}$).

Figure 1C:
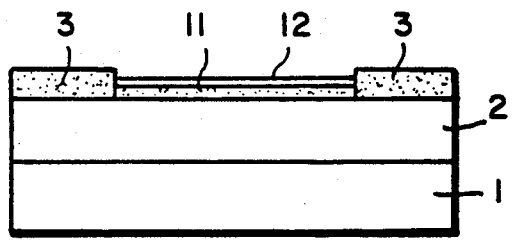

Then, on the $\beta$-SiC single-crystal layer 2, a silicon oxide ($SiO_2$) film (the thickness thereof being about 1 $\mu$m) was formed by the CVD technique. For the growth of the $SiO_2$ film, the plasma chemical vapor deposition technique may also be used. Then, with the use of photolithography, the portion of the $SiO_2$ film corresponding to a device active region was removed by an etching technique to form a field insulating film 3, as shown in FIG. 1c. As an etchant for the etching of the $SiO_2$ film, a solution of hydrogen fluoride (HF) was used. Next, on the $\beta$-SiC single-crystal layer 2, a thermal oxide film 11 (the thickness thereof being about 50 nm) was formed by thermal oxidation in an atmosphere of oxygen at about 1100° C. for 3 hours. Then, as shown in FIG. 1c, on the thermal oxide film 11, a phosphorus-doped Si polycrystalline layer 12 (the thickness thereof being about 500 nm) was formed by chemical vapor deposition.

Figure 1D:
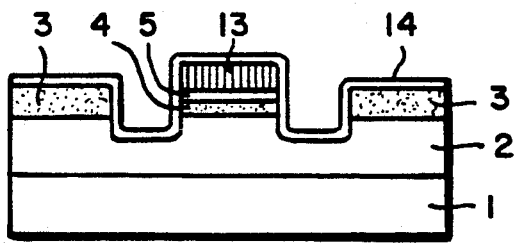
Figure 1E:
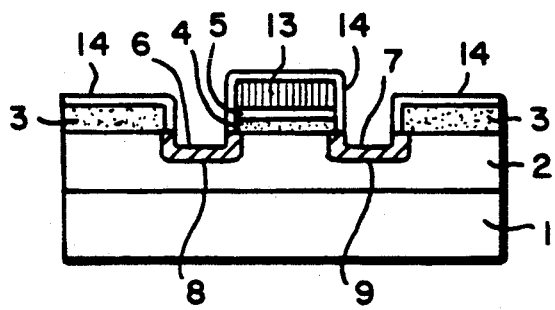

Next, as shown in FIG. 1d, a resist pattern 13 (the length thereof being 5 $\mu$m) for use in preparing a gate electrode was formed with the use of photolithography, after which the portions of the thermal oxide film 11 and Si polycrystalline film 12 corresponding to the source and drain regions were removed by an etching technique to form a gate insulator film 4 and a gate electrode 5. Furthermore, the exposed surface portions of the $\beta$-SiC single-crystal layer 2 were etched down to the depth of 200 nm, and a platinum (Pt) thin film 14 (the thickness thereof being 100 nm) was formed by electron beam deposition as shown in FIG. 1d. Then, a thermal anneal treatment was conducted in an atmosphere of nitrogen at about 200° C. for 20 minutes, by which SiC and Pt reacted with each other to form silicide films 6 and 7, as shown in FIG. 1e. These silicide films 6 and 7 provided Schottky contacts on the $\beta$-SiC single-crystal layer 2, resulting in a source region 8 and a drain region 9.

Thereafter, the portion of the Pt thin film 14 formed above the gate electrode 5 was removed together with the resist pattern 13, whereas the portion of the Pt thin film 14 formed on the surface of the field insulating film 3 and gate insulator film 4 was removed by an etching technique. As an etchant for the etching of the Pt thin film, aqua regia was used. Finally, a wiring electrode 10 was formed by vacuum deposition of aluminum (Al) and then with the use of photolithography, resulting in an inversion-mode p-channel MOSFET as shown in FIG. 1a, where both the source and drain regions were formed by the use of a Schottky contact on the SiC layer.

For the purpose of comparison, a conventional inversion-mode p-channel MOSFET was produced in the same way as described above, except that an n-type $\beta$-SiC single-crystal layer was formed as a channel-formation layer on the Si single-crystal substrate and then provided therein with p-type source and drain regains by ion implantation of, for example, boron (B) in the channel-formation layer.

Figure 2:
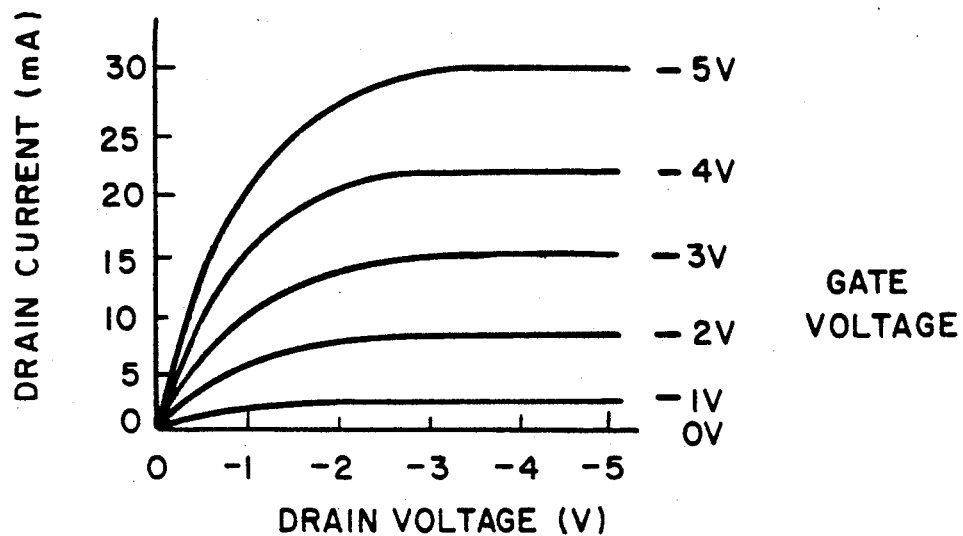
Figure 3:
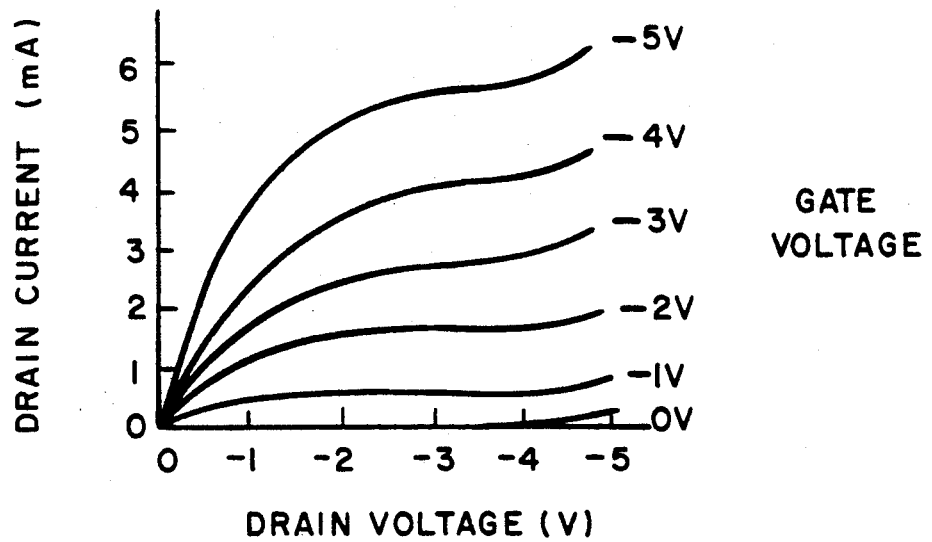
FIG. 3 is a graph showing the drain current-voltage of a conventional of a conventional inversion-mode MOSFET in which the source and drain regions are formed by ion implantation.

The transistor characteristics (drain current-voltage characteristics) of the MOSFETs thus obtained, that is, the MOSFET of this example and the conventional MOSFET produced above, were measured. The results are shown in FIGS. 2 and 3. As can be seen from these figures, the MOSFET of this example (FIG. 2) showed excellent drain-current saturation and significantly reduced leakage current as compared with the conventional MOSFET (FIG. 3), because the source and drain regains were formed by the use of a Schottky contact on the SiC layer. For example, the leakage current in the off state (at a gate voltage of 0 V) to a drain voltage of $-5$ V was 20 $\mu$A with respect to the conventional MOSFET, whereas the leakage current of the MOSFET of this example under the same condition was only 0.1 $\mu$A. In addition, the internal resistance of MOSFETs in the on state (at a gate voltage of $-5$ V), that is, on-state resistance, was 2 kiloohm with respect to the conventional MOSFET, whereas the on-state resistance of the MOSFET of this example was only 400 ohm, indicating that the MOSFET of this example had a significantly reduced on-state resistance as compared with that of the conventional MOSFET.

Although the above-described example shows the production of the inversion-mode p-channel MOSFET in which the source and drain regions are formed by the use of a Schottky contact on the n-SiC layer, this invention can also be applied to an inversion-mode n-channel MOSFET in which the source and drain regions are formed by the use of a Schottky contact on the p-SiC layer.

It is understood that various other modification will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a silicon carbide field-effect transistor with an MOS structure composed successively of a silicon carbide layer, a gate insulator film, and a gate electrode, said transistor comprising source and drain regions formed in said silicon carbide layer, and said MOS structure being disposed between the source and drain regions, wherein at least one of said source and drain regions is formed by the use of a Schottky contact on the silicon carbide layer, and said Schottky contact is made with a material selected from the group consisting of a metal and a metal compound thereof.

2. A silicon carbide field-effect transistor according to claim 1, wherein said Schottky contact is formed on the n-type silicon carbide with a metal which is selected from the group consisting of platinum (Pt), gold (Au), and titanium (Ti).

3. A silicon carbide field-effect transistor according to claim 1, wherein said Schottky contact is formed on the p-type silicon carbide with a metal which is selected from the group consisting of aluminum (Al) and silver (Ag).

4. A silicon carbide field-effect transistor according to claim 1, wherein said gate insulator film is formed from silicon oxide.

5. A silicon carbide field-effect transistor according to claim 1, wherein said gate electrode is formed from polycrystalline silicon.

6. A silicon carbide field-effect transistor according to claim 1, wherein said compound of the metal is silicide.

7. A silicon carbide field-effect transistor according to claim 6, wherein said silicide is formed by a reaction of platinum and silicon carbide.

8. In a silicon carbide field-effect transistor with an MOS structure composed successively of a silicon carbide layer, a gate insulator film, and a gate electrode, said transistor comprising source and drain regions formed in said silicon carbide layer, and said MOS structure being disposed between the source and drain regions, wherein each of the source and drain regions is formed by use of a Schottky contact made by providing a metal selected from the group consisting of platinum, gold, titanium and a silicide thereof on the silicon carbide layer.

* * * * *